(12) United States Patent
Ota et al.

(10) Patent No.: US 11,104,282 B2
(45) Date of Patent: Aug. 31, 2021

(54) CIRCUIT ASSEMBLY

(71) Applicants: AUTONETWORKS TECHNOLOGIES, LTD., Yokkaichi (JP); SUMITOMO WIRING SYSTEMS, LTD., Yokkaichi (JP); SUMITOMO ELECTRIC INDUSTRIES, LTD., Osaka (JP)

(72) Inventors: Takuya Ota, Yokkaichi (JP); Shigeki Yamane, Yokkaichi (JP); Hirotoshi Maeda, Yokkaichi (JP); Toshiyuki Tsuchida, Yokkaichi (JP); Junya Aichi, Yokkaichi (JP)

(73) Assignees: AUTONETWORKS TECHNOLOGIES, LTD., Mie (JP); SUMITOMO WIRING SYSTEMS, LTD., Mie (JP); SUMITOMO ELECTRIC INDUSTRIES, LTD., Osaka (JP)

( * ) Notice: Subject to any disclaimer, the term of this patent is extended or adjusted under 35 U.S.C. 154(b) by 299 days.

(21) Appl. No.: 16/081,686

(22) PCT Filed: Mar. 1, 2017

(86) PCT No.: PCT/JP2017/008074
§ 371 (c)(1),
(2) Date: Aug. 31, 2018

(87) PCT Pub. No.: WO2017/154696
PCT Pub. Date: Sep. 14, 2017

(65) Prior Publication Data
US 2019/0118735 A1 Apr. 25, 2019

(30) Foreign Application Priority Data

Mar. 10, 2016 (JP) .............................. JP2016-046957

(51) Int. Cl.
*H05K 1/02* (2006.01)
*H05K 1/18* (2006.01)
(Continued)

(52) U.S. Cl.
CPC ............. *B60R 16/02* (2013.01); *H01F 27/06* (2013.01); *H01F 27/22* (2013.01);
(Continued)

(58) Field of Classification Search
CPC .......... B60R 16/02; H05K 7/209; H05K 7/06; H05K 7/14; H05K 7/20; H01F 27/29;
(Continued)

(56) References Cited

U.S. PATENT DOCUMENTS 5,604,673 A * 2/1997 Washburn ........... H01L 23/5383
257/E23.173
2010/0254093 A1 * 10/2010 Oota .................... B60R 16/0239
361/720

(Continued)

FOREIGN PATENT DOCUMENTS

JP  2005-158830 A  6/2005
JP  2006-100553 A  4/2006

(Continued)

OTHER PUBLICATIONS

Apr. 11, 2017 International Search Report issued in International Patent Application No. PCT/JP2017/008074.

*Primary Examiner* — Ishwarbhai B Patel
(74) *Attorney, Agent, or Firm* — Oliff PLC

(57) ABSTRACT

A circuit assembly where the circuit board includes a first surface and a second surface that is opposite to the first surface and on which a plurality of bus bars are routed, the inductor includes a main body and a terminal that is led out from the main body and has a shape that is bent toward the circuit board, and a leading end of the terminal is connected (Continued)

through a screwing member to a bus bar of the plurality of bus bars exposed from an opening provided on the circuit board, the screwing member is held in an insulating holder housed in a housing recess provided in the heat dissipation plate, and the heat dissipation plate is overlaid so as to transfer heat on the circuit board on the second surface of the circuit board.

5 Claims, 8 Drawing Sheets

(51) Int. Cl.
| | |
|---|---|
| B60R 16/02 | (2006.01) |
| H01F 27/06 | (2006.01) |
| H01F 27/22 | (2006.01) |
| H05K 7/20 | (2006.01) |
| H01F 27/29 | (2006.01) |
| H05K 7/06 | (2006.01) |
| H05K 7/14 | (2006.01) |
| H01F 27/28 | (2006.01) |
| H02G 3/16 | (2006.01) |
| H05K 1/11 | (2006.01) |

(52) U.S. Cl.
CPC ......... *H01F 27/2804* (2013.01); *H01F 27/29* (2013.01); *H05K 1/0203* (2013.01); *H05K 1/181* (2013.01); *H05K 7/06* (2013.01); *H05K 7/14* (2013.01); *H05K 7/20* (2013.01); *H05K 7/209* (2013.01); *H05K 7/20509* (2013.01); *H01F 2027/065* (2013.01); *H02G 3/16* (2013.01); *H05K 1/0212* (2013.01); *H05K 1/0233* (2013.01); *H05K 1/11* (2013.01)

(58) Field of Classification Search
CPC ...... H01F 27/2804; H01F 27/06; H01F 27/22; H02G 3/16
See application file for complete search history.

(56) References Cited

U.S. PATENT DOCUMENTS

| | | | |
|---|---|---|---|
| 2011/0100681 A1* | 5/2011 | Kimmich | ............ H01L 23/3677 174/252 |
| 2016/0125997 A1* | 5/2016 | Hwang | .................. H01F 37/00 336/61 |
| 2017/0149222 A1 | 5/2017 | Kobayashi et al. | |

FOREIGN PATENT DOCUMENTS

| | | |
|---|---|---|
| JP | 2011-187838 A | 9/2011 |
| JP | 2013-099071 A | 5/2013 |
| JP | 2015-216753 A | 12/2015 |

* cited by examiner

CIRCUIT ASSEMBLY

This application is the U.S. National Phase of PCT/JP2017/008074 filed Mar. 1, 2017, which claims priority form JP 2016-046957 filed Mar. 10, 2016, the entire disclosure of which is incorporated herein by reference.

BACKGROUND

The technique disclosed in the present specification is related to a circuit assembly.

Conventionally, a circuit assembly disclosed in JP 2013-99071A has been known as a circuit assembly in which an inductor such as a coil is connected to a circuit board. This circuit assembly includes a circuit board and a heat dissipation member made of metal that dissipates the heat of the circuit board to the outside.

A bus bar is routed on the circuit board. A heat dissipation plate is overlaid on the surface of the circuit board on the side on which the bus bar is routed.

If the terminal of the inductor and the bus bar are connected using a fastening member such as a bolt, the terminal of the inductor and the bus bar cannot be directly fastened by screw to the heat dissipation member. This is because the terminal of the inductor and the bus bar short-circuit with the heat dissipation member.

In view of this, in JP 2013-99071, the terminal of the inductor and the bus bar are fastened by screw in a state in which the bus bar is caused to protrude outward from the edge of the circuit board and to bend in a direction away from the heat dissipation member.

SUMMARY

However, with the above-described configuration, the terminal of the inductor is disposed at a position away from the heat dissipation member. For this reason, there has been a problem in that the ability to dissipate heat from the terminal of the inductor decreases.

An exemplary aspect of the disclosure provides a circuit assembly with an excellent heat dissipating ability.

The technique disclosed in the present specification is a circuit assembly including: a circuit board; a heat dissipation plate overlaid on the circuit board; and an inductor, wherein the circuit board includes a first surface and a second surface that is opposite to the first surface and on which a plurality of bus bars are routed, the inductor includes a main body and a terminal that is led out from the main body and has a shape that is bent toward the circuit board, and a leading end of the terminal is connected through a screwing member to a bus bar of the plurality of bus bars exposed from an opening provided on the circuit board, the screwing member is held in an insulating holder housed in a housing recess provided in the heat dissipation plate, and the heat dissipation plate is overlaid so as to transfer heat on the circuit board on the second surface of the circuit board.

According to this configuration, the terminal of the inductor has a shape that is bent toward the circuit board, and the terminal of the inductor is connected to the bus bar exposed from the opening of the circuit board. Also, the heat dissipation plate is overlaid so as to transfer heat on the second surface side of the circuit board on which the bus bar is disposed. Accordingly, the heat generated by the inductor is transferred from the terminal of the inductor to the bus bar and is further transferred from the bus bar to the heat dissipation plate. Accordingly, the heat dissipating ability of the circuit assembly can be improved.

The above-described circuit assembly may include the following configuration.

It is also possible to use a configuration in which the main body opening that exposes the heat dissipation plate is provided in a region of the circuit board corresponding to the main body.

With this kind of configuration, the heat dissipating ability further improves since the heat of the main body of the inductor is transferred to the heat dissipation plate through the main body opening.

The inductor may be disposed on a first surface. According to this kind of configuration, the wiring density is ensured, and the heat generated on the first surface side is efficiently transferred to the heat dissipation plate disposed on the second surface side by using a terminal of an inductor, and thus the heat can be dissipated.

It is also possible to use a configuration in which a positioning protrusion that protrudes toward the circuit board is provided on an insulating holder and a positioning hole is provided at a position corresponding to the positioning protrusion of the circuit board.

When the terminal of the inductor and the bus bar are to be connected with a bolt and a nut, a positioning task is important, and the positioning task is simplified by providing the positioning mechanism of this configuration.

It is also possible to use a configuration in which an insulating layer that covers a boundary between the insulating holder and the heat dissipation plate is provided at a region including the boundary between the second surface of the circuit board and the heat dissipation plate.

By using this configuration, it is possible to reliably insulate the vicinity of the hole edge of the housing groove of the heat dissipation plate and the bus bar.

According to the technique disclosed in the present specification, it is possible to provide a circuit assembly with an excellent heat dissipating ability.

DETAILED DESCRIPTION OF EMBODIMENTS

Embodiment 1

Embodiment 1 will be described with reference to FIGS. 1 to 8. A circuit assembly 10 of the present embodiment can be disposed on a power supply path between a power source such as a battery of a vehicle and a load composed of a vehicle-mounted electrical component or the like, such as a lamp or a wiper, and the circuit assembly 10 can be used in a DC-DC converter, an inverter, or the like.

Figure 1:
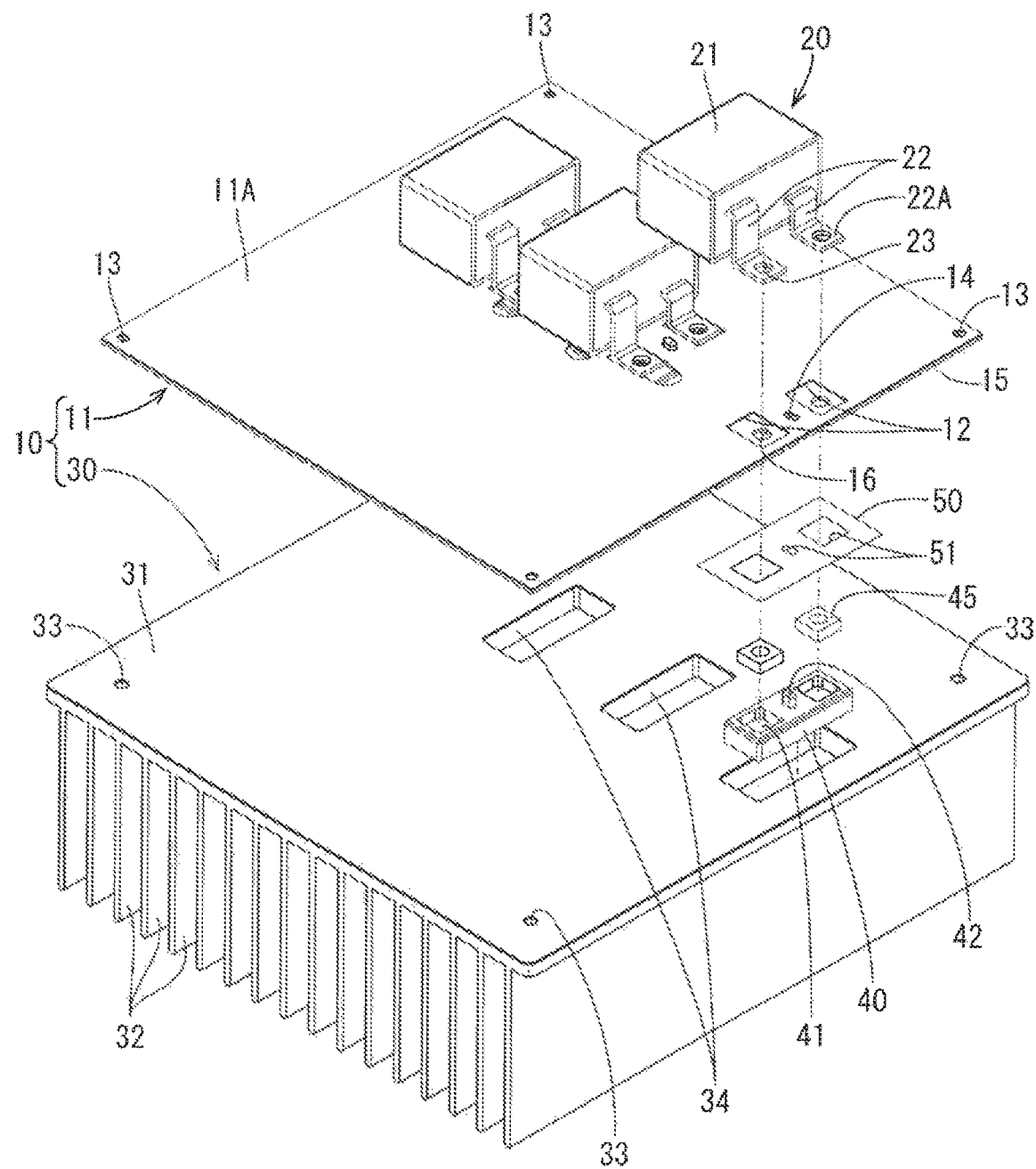
FIG. 1 is an exploded perspective view of a circuit assembly of Embodiment 1.
Figure 2:
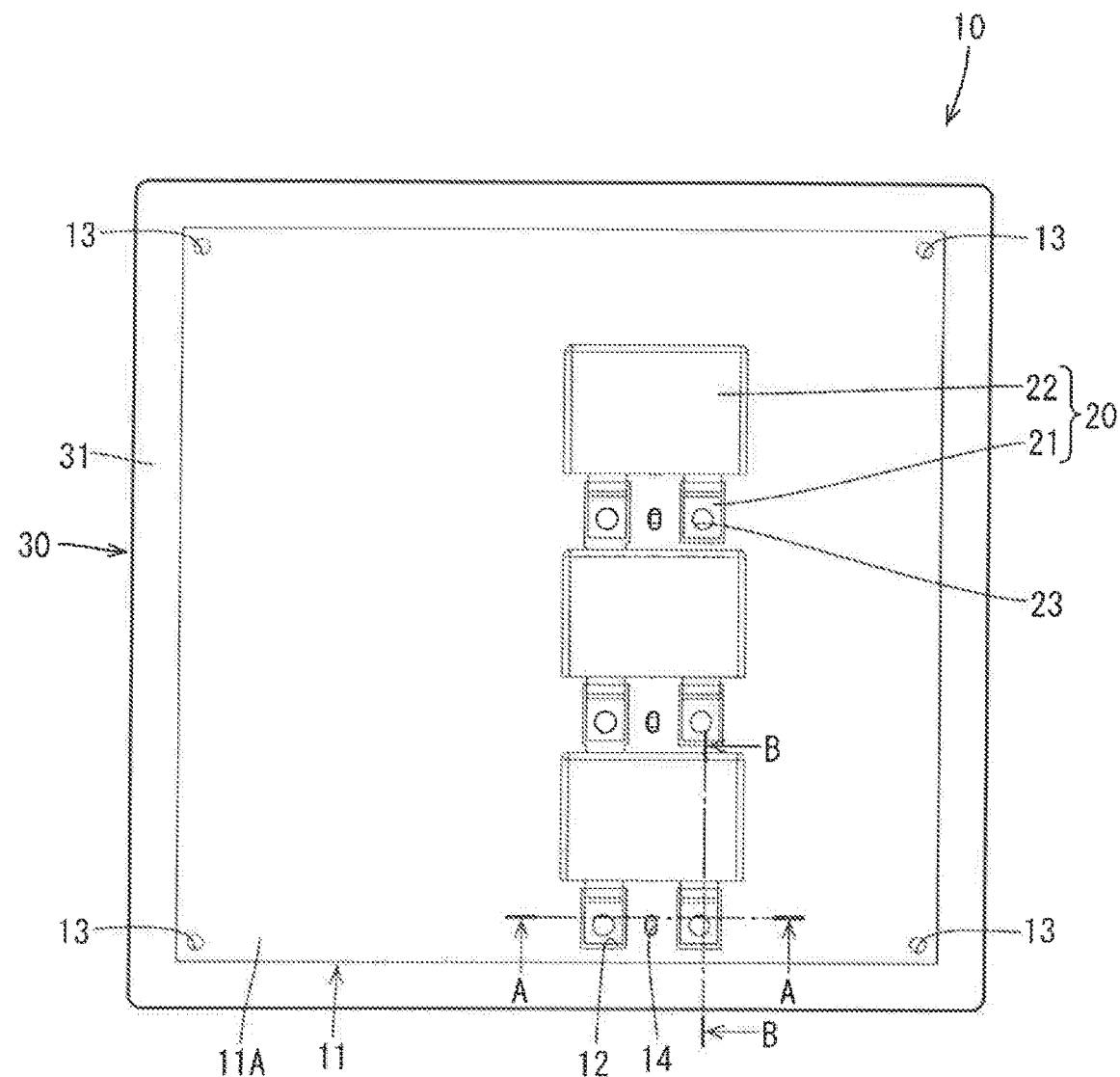
FIG. 2 is a plan view of a circuit assembly.
Figure 3:
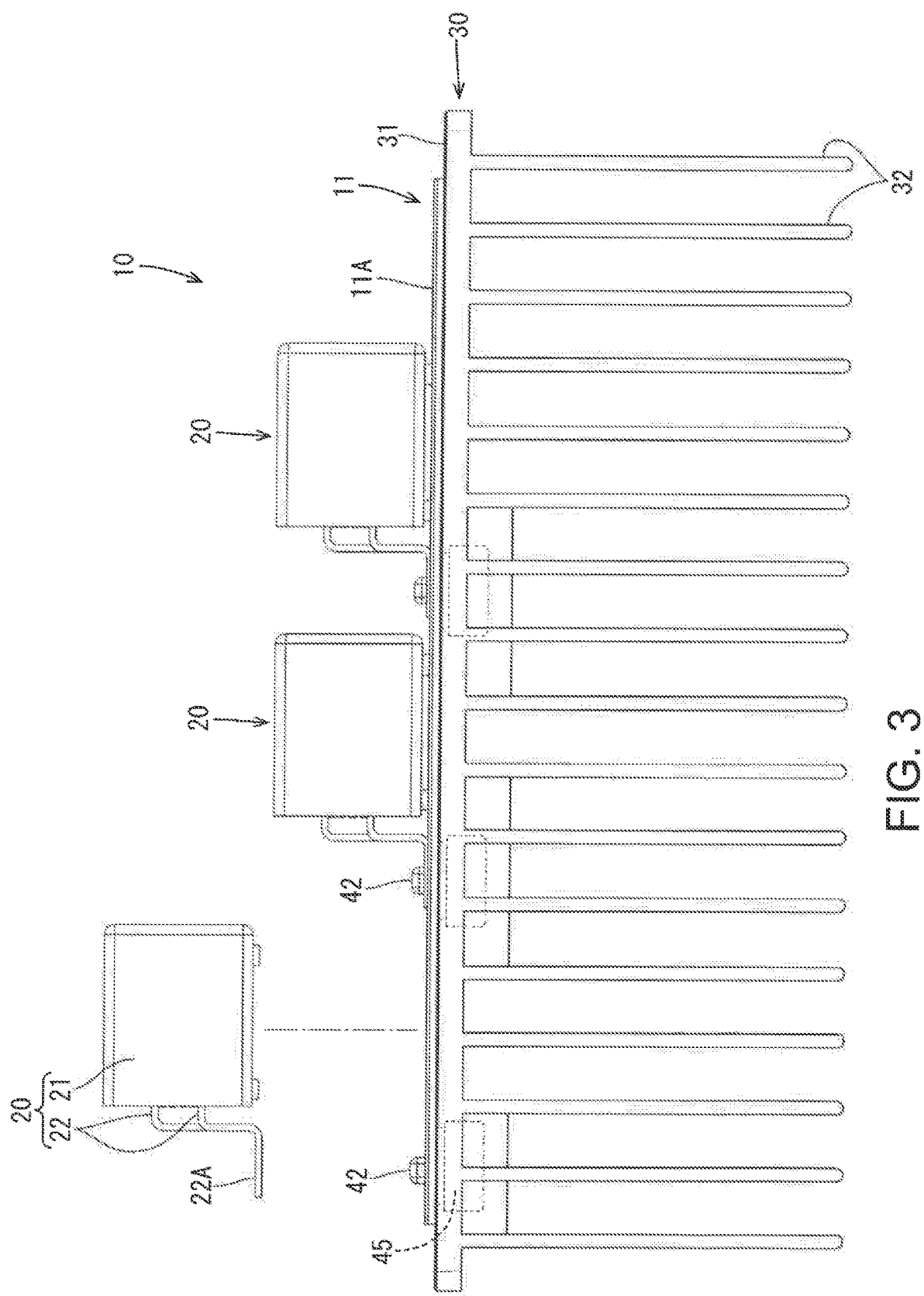
FIG. 3 is a right-side view of a circuit assembly.

In the following description, the upper side in FIGS. 1 and 3 is the surface side or the upper side, and the lower side is the underside or the lower side. Also, the lower side in FIG. 2 is forward (front surface), the upper side is rearward (rear surface), the right side is right, and the left side is left.

As shown in FIG. 1, the circuit assembly 10 includes a circuit board 11, and a heat dissipation plate 30 overlaid on the underside surface (the lower surface in FIG. 3) of the circuit board 11.

Circuit Board 11

The circuit board 11 is formed by forming a printed wire circuit (not shown) through a print wiring technique and arranging electronic components on the upper surface of an insulating substrate, and by routing multiple bus bars 15 in a predetermined pattern on the underside surface of the insulating substrate.

In the present embodiment, only relatively large-sized coils 20 (examples of inductors) among the multiple electronic components are illustrated, and the other electronic components are omitted. Also, the surface of the circuit board 11 (upper-side surface) on which the coil 20 is installed is a first surface 11A, and the opposite surface (underside surface) is a second surface 11B.

The circuit board 11 has an approximately rectangular shape, and multiple opening portions 12 (i.e., openings) are provided at predetermined positions. These opening portions 12 are for installing the coils 20 on the bus bars 15. The opening portions 12 are provided in the regions in which the connection portions 22A of the later-described coil 20 are to be disposed, and the opening portions 12 expose portions of the bus bars 15 to the upper surface side of the circuit board 11.

A positioning hole 14 for positioning a later-described insulating holder 40 is formed through the circuit board 11 between a pair of opening portions 12 at which a pair of connection portions 22A of a coil 20 of the circuit board 11 are to be connected to the bus bars 15.

Substrate-side fixing holes 13 for fixing the circuit board 11 to the heat dissipation board 30 are fixed near the four corners of the circuit board 11.

The coil 20 used in the present embodiment is an edgewise coil obtained by winding a rectangular wire in an edgewise manner, and is a so-called laterally-oriented coil 20 having a form in which a pair of flat terminal portions 22 (i.e., terminals) (two end portions of the rectangular wire) are led out from one side surface of a cuboid-shaped main body portion 21 (i.e., main body) and are bent in a crank shape. The terminal portions 22 are bent in a direction of approaching the circuit board 11.

The leading end portions (i.e., leading ends) of the terminal portions 22 are extended so as to conform to the first surface 11A of the circuit substrate 11, and are used as connection portions 22A to be connected to the bus bars 15. Note that coil-side connection holes 23 through which bolts (examples of screwing members) (not shown) are to be passed are formed through the connection portions 22A.

Note that the connection portions 22A are arranged slightly below the bottom surface of the main body portion 21, and the connection portions 22A are set so as to be overlaid on the bus bars 15 when the main body portions 21 are mounted on the first surface 11A.

Bus bar-side connection holes 16 through which bolts (not shown) are to be passed are provided at the portions of the bus bars 15 that are exposed from the above-described opening portions 12. The bus bar-side connection holes 16 and the coil-side connection holes 23 are set to overlap in a state in which the connection portions 22A of the coil 20 are overlaid.

Heat Dissipation Plate 30

The heat dissipation plate 30 is composed of a metal material with an excellent heat transfer ability, such as aluminum or an aluminum alloy, and the heat dissipation plate 30 has a function of dissipating the heat generated in the circuit board 11.

The upper surface 31 of the heat dissipation plate 30 is approximately flat plate-shaped, and the lower surface is provided with many plate-shaped fins 32 that extend downward (see FIG. 1).

In the state in which the circuit board 11 is mounted at a predetermined position on the upper surface 31 of the heat dissipation plate 30, heat dissipation plate-side fixing holes 33 are provided at positions corresponding to the substrate-side fixing holes 13 of the circuit board 11.

Furthermore, as shown in FIG. 1, housing recesses 34 that are recessed downward from the upper surface 31 and house the later-described insulating holders 40 are provided at regions including the regions of the heat dissipation plate 30 on which the connection portions 22A of the above-described coils 20 are arranged.

Note that an insulating sheet for achieving insulation between the heat dissipation plate 30 and the circuit board 11 (bus bars 15) is overlaid on the upper surface of the heat dissipation plate 30, although this is not shown in the drawings. The insulating sheet is sticky, and hole portions for exposing the housing recesses 34 are provided at regions corresponding to the housing recesses 34.

Insulating Holders 40

Figure 6:
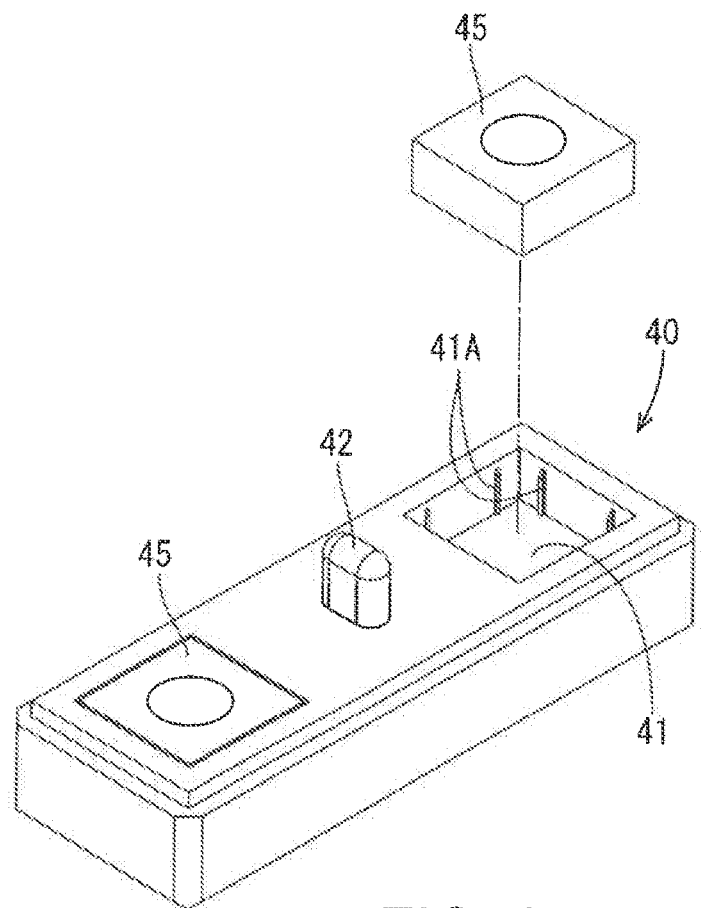
FIG. 6 is a perspective view of nuts and an insulating holder.
Figure 7:
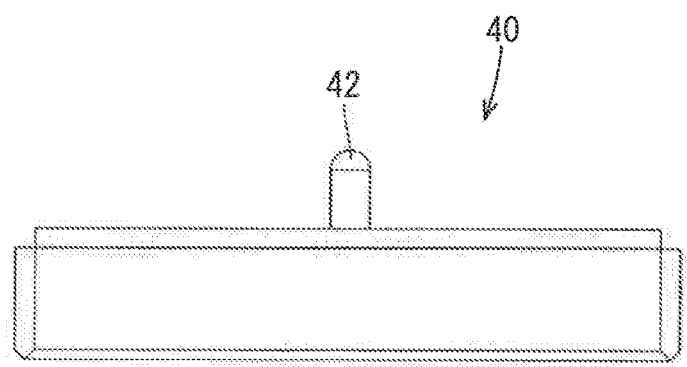
FIG. 7 is a front view of an insulating holder.
Figure 8:
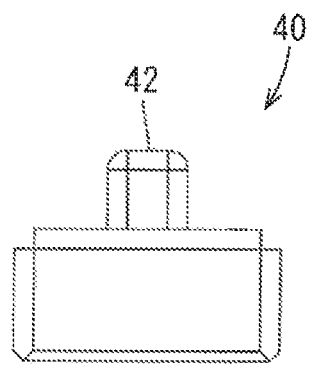
FIG. 8 is a side view of an insulating holder.

The insulating holders 40 are housed in the housing recesses 34 of the heat dissipation plate 30. The insulating holders 40 are members that are made of synthetic resin and have somewhat flat approximately cuboid shapes, as shown in FIGS. 6 to 8. Pairs of nut housing portions 41 into which nuts 45 (examples of screwing members) capable of screwing onto the above-described bolts (not shown) are fit are provided recessed downward on the upper surface sides of the insulating holders 40. Multiple contact ribs 41A that extend in the up-down direction are provided on the inner walls of the nut housing portions 41.

Also, positioning protrusions 42 that protrude upward are provided between the pairs of nut housing portions 41. Each positioning protrusion 42 is provided at a position and with a size that correspond to a positioning hole 14 of the above-described circuit board 11.

Figure 4:
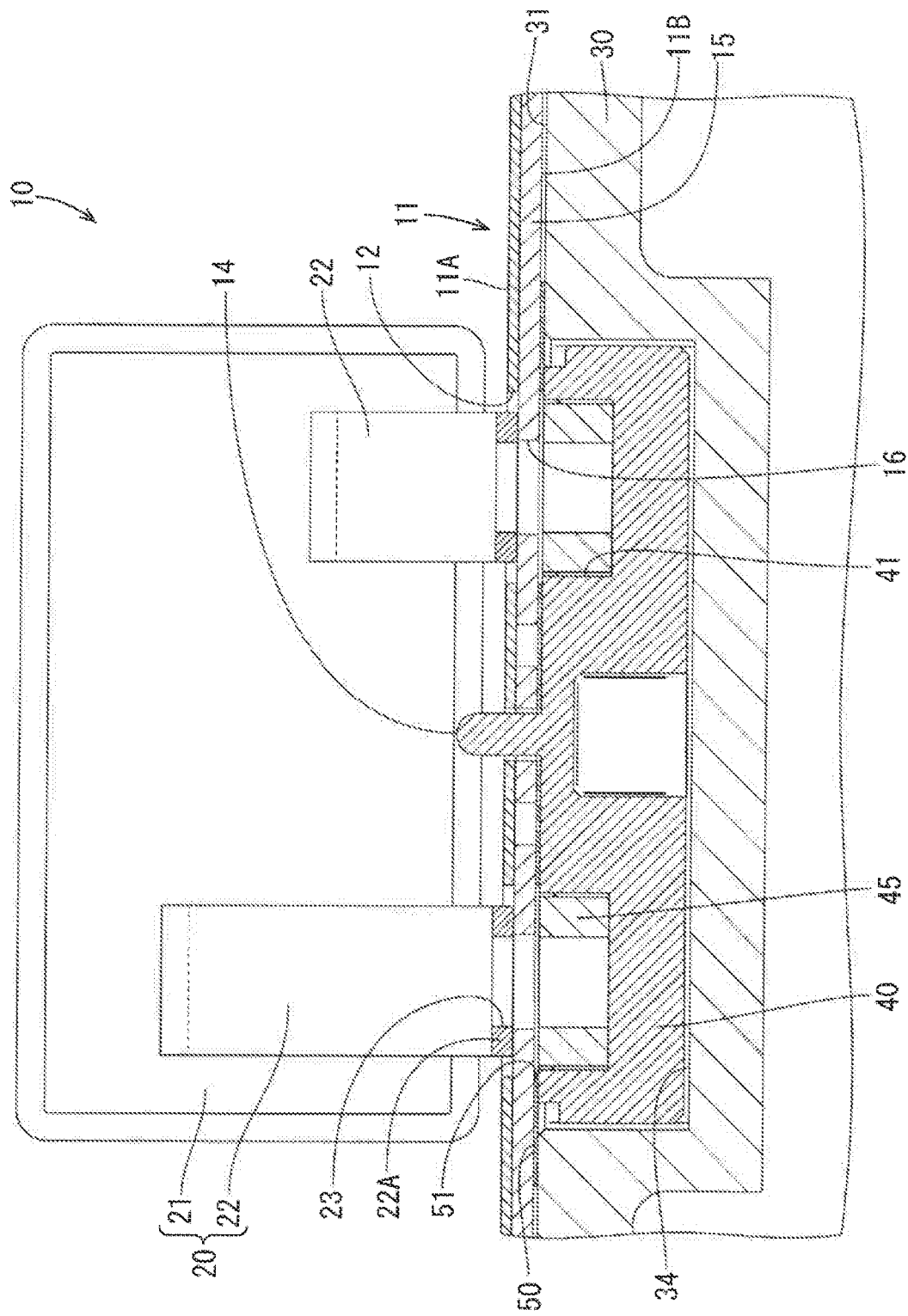
FIG. 4 is a cross-sectional view taken along line A-A in FIG. 2.
Figure 5:
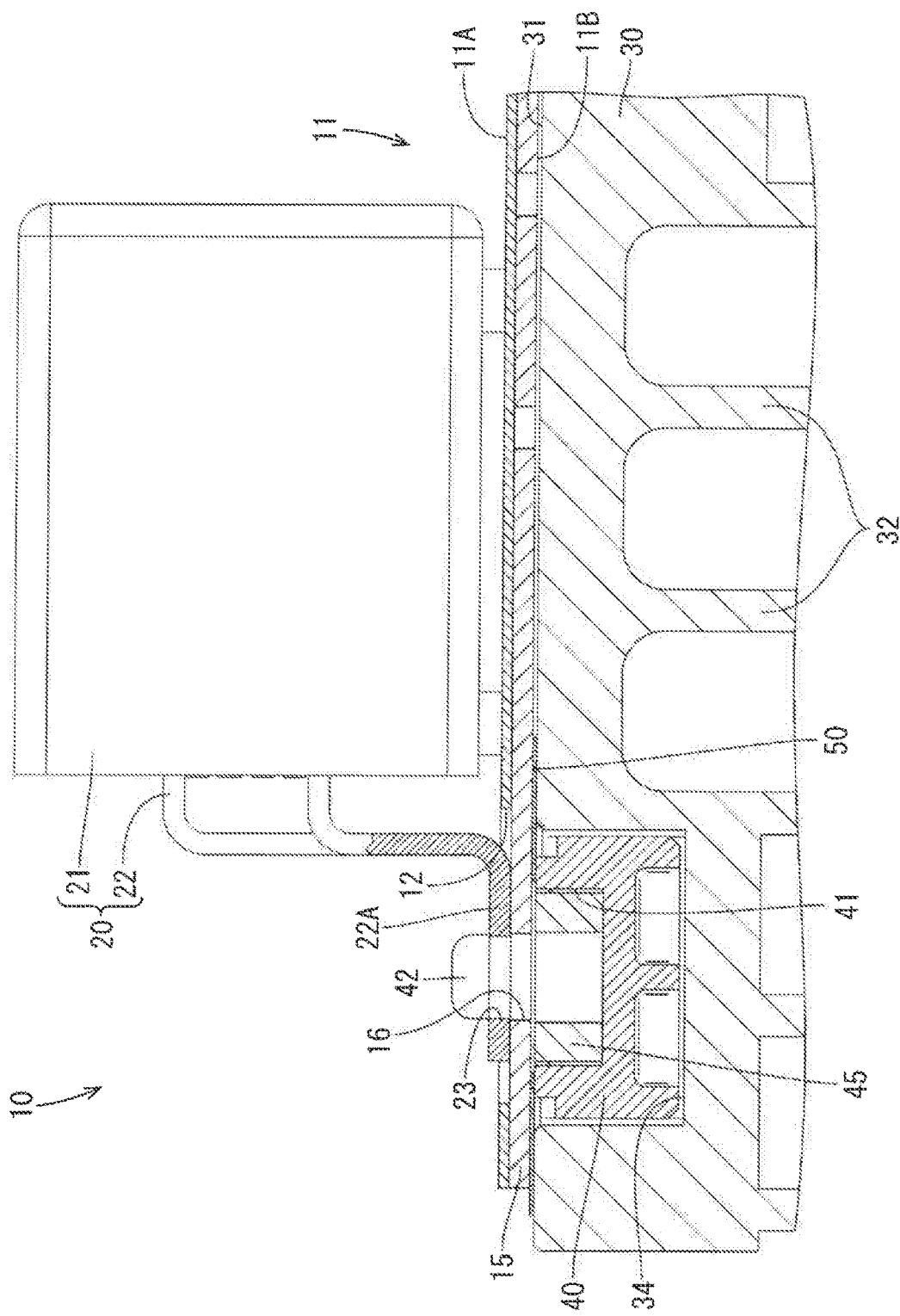
FIG. 5 is a cross-sectional view taken along line B-B in FIG. 2.

As shown in FIG. 4, the dimension of the outer shape of the insulating holder 40 is set to a dimension that is almost perfectly housed inside of the housing recess 34 of the above-described heat dissipation plate 30. Also, the height dimension is approximately the same as the depth dimension of the housing recess 34.

Note that the peripheral edge portion of the upper surface of the insulating holder 40 has a cross section with a step shape cut out in a rectangular shape. Also, a thinner portion for achieving a lighter weight is provided recessed upward on the lower surface side.

Insulating Sheet 50

In the state in which the heat dissipation plate 30 and the circuit board 11 overlap, insulating sheets 50 are arranged between the insulating holders 40 and the bus bars 15 (second surface 11B of the circuit board 11). As shown in FIGS. 1 and 4, the outer shape of an insulating sheet 50 has slightly larger dimensions than the hole edge portion of a housing recess 34, and is provided with opening portions 51 at positions corresponding to the nut housing portions 41 and the positioning protrusion 42 in a state of being stacked on the heat dissipation plate 30 and the insulating holder 40.

The insulating sheet 50 is set so as to cover the boundary portion (i.e., boundary) (vicinity of the hole edge of the housing recess 34) between the housing recess 34 and the insulating holder 40 when stacked on the heat dissipation plate 30 and the insulating holder 40.

Method for Manufacturing Circuit Assembly 10

Next, a method for manufacturing the circuit assembly 10 of the present embodiment will be described. First, a printed circuit board (not shown) is printed using a print wiring technique onto the upper surface side of the insulating substrate on which the opening portions 12, the substrate-side fixing holes 13, and the positioning holes 14 have already been formed, and the multiple bus bars 15 are routed and adhered in a predetermined pattern on the underside surface.

Next, electronic components (not shown, except for the coils 20) are mounted at predetermined positions on the upper surface (first surface 11A of the circuit substrate 11) of the insulating substrate, and are connected to the printed wire circuit on the upper surface (and the bus bars 15 on the underside surface) through reflow soldering.

Next, the insulating holders 40 holding the nuts 45 are housed inside of the housing recesses 34 of the heat dissipation plate 30, and the insulating sheet (not shown) for insulating against the circuit board 11 (bus bars 15) is attached at a predetermined position on the upper surface 31 of the heat dissipation plate 30. Also, the above-described insulating sheets 50 are mounted. At this time, the positioning protrusions 42 of the insulating holders 40 are inserted into the predetermined opening portions 51 of the insulating sheet 50, whereby the insulating holders 40 and the insulating sheet 50 are positioned.

Next, the circuit board 11, to which the electronic components other than the coils 20 are connected, is mounted on the insulating sheet. At this time, the positioning protrusions 42 of the insulating holders 40 are inserted into the positioning holes 14 of the insulating sheet 11, whereby the insulating holders 40 and the circuit board 11 are positioned. Thereafter, the circuit board 11 and the heat dissipation plate 30 are fixed by screwing fixing bolts (not shown) into the substrate-side fixing holes 13 and the heat dissipation plate-side fixing holes 33 that have been overlaid on each other.

Next, the coils 20 are mounted at predetermined positions on the first surface 11A of the circuit board 11 and the connection portions 22A of the coils 20 are overlaid on the bus bars 15 exposed from the opening portions 12. Then, the bolts (not shown) are passed through the coil-side connection holes 23 and the bus bar-side connection holes 16 and are screwed into nuts 45, and thus the coils 20 are connected and electrical conduction is established with the bus bars 15, and the coils 20 are fixed on the circuit board 11.

Accordingly, the circuit assembly 10 on which the electrical components including the coils 20 are mounted is completed.

Effects

According to the present embodiment, even with a configuration in which the terminal portions 22 of the coil 20 and the bus bars 15 are connected through fastening with bolts and nuts, the nuts 45 arranged on the underside surface (second surface 11B) of the circuit board 11 are housed in the housing recesses 34 provided on the heat dissipation plate 30, and therefore do not interfere with the heat dissipation plate 30.

Also, the terminal portions 22 of the coils 20 have shapes that are bent toward the circuit board 11, and are connected to the bus bars 15 exposed from the opening portions 12 of the circuit board 11. Also, the heat dissipation plate 30 is overlaid so as to transfer heat on the second surface 11B side of the circuit substrate 11 on which the bus bars 15 are arranged. Accordingly, the heat generated by the coils 20 is transferred from the terminal portions 22 of the coils to the bus bars 15, and is further transferred from the bus bars 15 to the heat dissipation plate 30. That is, the heat generated on the first surface 11A side is efficiently transferred to the heat dissipation plate 30 disposed on the second surface 11B side by using the terminal portions 22 of the coils 20, and thus the heat can be dissipated.

Also, the connection portions between the coils 20 and the bus bars 15 can be provided at a desired position on the inner side of the circuit board 11, and portions of the bus bars 15 that connect to the coils 20 need not be led out from the edge portions of the circuit board 11, and the bus bars 15 need not be bent as in the conventional technique. Thus, the degree of freedom in the design increases.

Also, when the terminals 22 of the coils 20 (connection portions 22A) and the bus bars 15 are to be fastened with bolts and nuts, the task of positioning the multiple members is troublesome, but according to the present embodiment, the coil-side connection holes 23, the bus bar-side connection holes 16, and the hole portions of the nuts 45 are automatically positioned by the positioning protrusions 42 of the insulating holders 40 and the positioning holes 14 of the circuit board 11, and therefore the positioning task is simple.

Furthermore, the insulating sheets 50 that covers the boundary portions (near the hole edges of the housing recesses 34) between the insulating holders 40 and the upper surface 31 of the heat dissipation plate 30 are provided, and therefore it is possible to reliably insulate the heat dissipation plate 30 and the circuit board 11 (bus bars 15).

Embodiment 2

Figure 9:
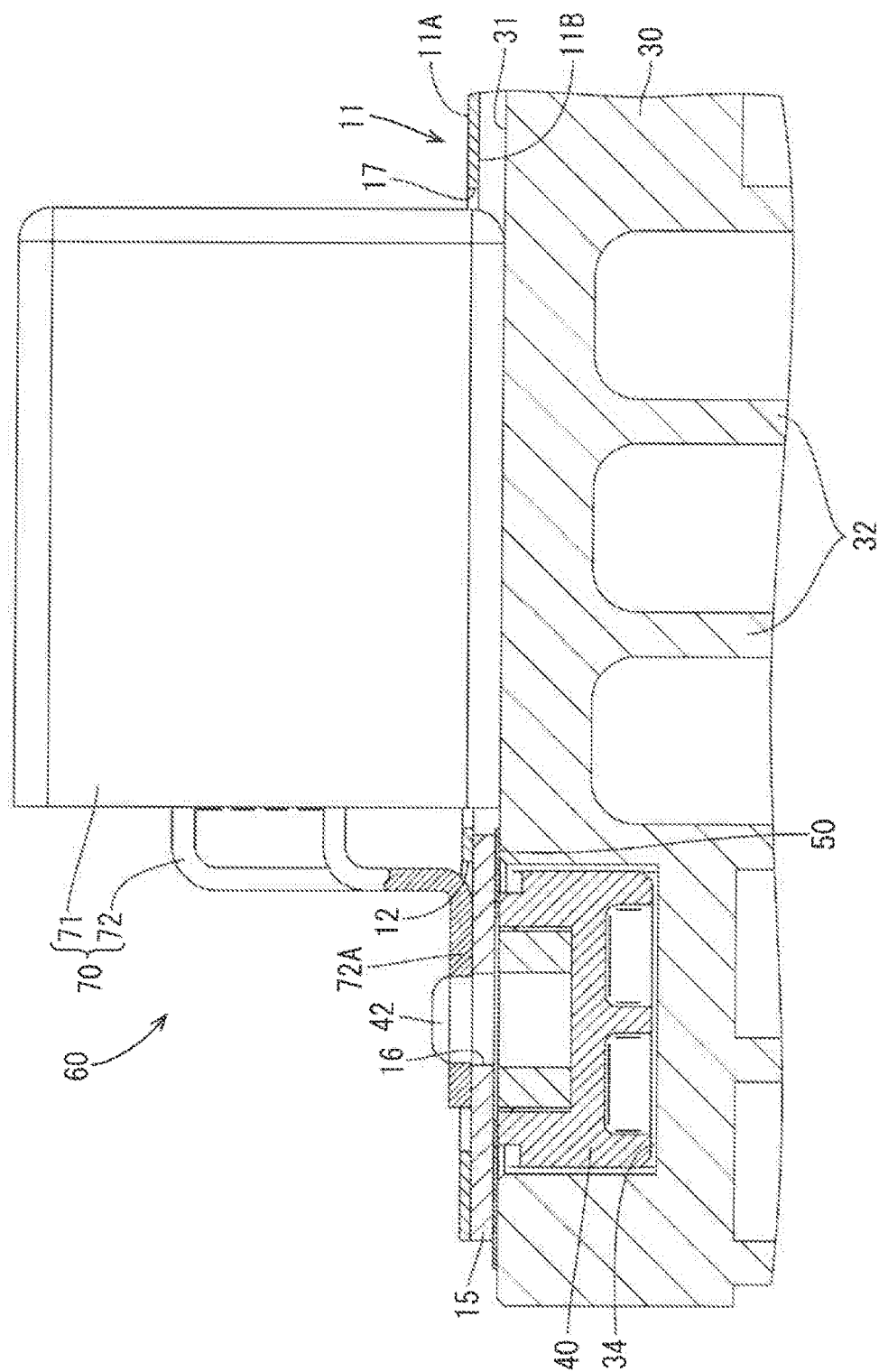
FIG. 9 is a partially enlarged cross-sectional view of a circuit assembly of Embodiment 2.

Embodiment 2 will be described next with reference to FIG. 9. Note that only the configurations that differ from Embodiment 1 will be described below, configurations that are similar to those in Embodiment 1 are denoted by the same reference numerals thereas, and redundant description thereof is omitted.

A circuit assembly 60 of the present embodiment differs from Embodiment 1 described above in that a main body portion opening 17 is provided in the circuit board 11 at a position corresponding to the main body portion 71 of the coil 70, and the main body portion 71 is directly placed on the heat dissipation plate 30 exposed from the main body portion opening 17. Note that no bus bars 15 are disposed in that region of the circuit board 11 in which the main body portion opening 17 is provided. Also, the connection portion 72A of the coil 70 is provided above the bottom surface of the main body portion 71 by an amount corresponding to the sum of the thicknesses of the bus bars 15 and the insulating sheet 50.

According to the circuit assembly 60 of this embodiment, the heat of the main body portion 71 of the coil 70 is directly transferred to the heat dissipation plate 30, and therefore the heat dissipating ability further improves.

Other Embodiments

The technique disclosed in the present specification is not limited to the embodiments described by means of the above description and the drawings, and for example, the following embodiments are also encompassed in the technical scope.

(1) In the above-described embodiment, a configuration was used in which the nuts 45 fit into the nut housing portions 41 of the insulating holders 40, but for example, it is also possible to use a configuration in which the nuts 45 are provided integrally in the insulating holders through molding.

(2) The positioning protrusions 42 and the positioning holes 14 can also be omitted.

(3) The insulating sheet 50 can also be omitted.

(4) In the above-described embodiment, a configuration was used in which the insulating holders 40 are housed in the housing recesses 34 of the heat dissipation plate 30 and the nuts 45 are fit into the nut housing portions 41 of the insulating holders 40, but it is also possible to use a configuration in which these members are fixed through adhesion.

(5) In the above-described embodiment, a configuration was used in which the nuts 45 are held in the insulating holders 40 and bolts (not shown) are screwed into them from the circuit board 11 side, but it is also possible to use a configuration in which the bolts are held in the insulating holders 40 and the nuts are screwed onto them from the circuit board 11 side.

(6) In the above-described embodiment, the insulating sheet 50 was used as the insulating layer, but there is no limitation to this, and the insulating layer may be an adhesive or a gel. Also, the insulating sheet may be sticky or adhesive.

(7) The shape of the insulating sheet 50 is not limited to the above-described embodiment, and may also be rectangular so as to cover only the hole edge portion of the housing recess 34.

(8) In the above-described embodiment, a configuration was used in which the insulating holders 40 are housed in the housing recesses 34 and thereafter the circuit board 11 is positioned and overlaid on the heat dissipation plate 30, but it is also possible to use a configuration in which the insulating holders 40 are adhered in advance to the circuit board 11 and thereafter the insulating holders 40 are arranged at the predetermined positions of the heat dissipation plate 30. This kind of configuration can be realized due to the insulating sheet 50 being sticky, for example.

(9) In the above-described embodiment, the insulating sheet 50 was used to achieve insulation between the heat dissipation plate 30 and the circuit board 11 (bus bars 15), but it is also possible to use a configuration that achieves insulation through an adhesive, grease, or the like. In the case of using an adhesive, bolt fastening of the substrate-side fixing holes 13 and the heat dissipation plate-side fixing holes 33 can be omitted.

(10) In the above-described Embodiment 2, a configuration was used in which the heat of the main body portion 71 is transferred directly to the heat dissipation plate 30 due to the main body portion 71 of the coil 70 being placed on the heat dissipation plate 30 exposed from the main body portion opening 17, but the main body portion 71 and the heat dissipation plate 30 need not be in direct contact. For example, it is also possible to use a configuration in which they are arranged opposing each other via a gap or a heat transferring sheet or the like is provided therebetween.

The invention claimed is:

1. A circuit assembly comprising:
a circuit board;
a heat dissipation plate overlaid on the circuit board; and
an inductor, wherein:
the circuit board includes a first surface and a second surface that is opposite to the first surface and on which a plurality of bus bars are routed,
the inductor includes a main body and a terminal that is led out from the main body and has a shape that is bent toward the circuit board, and a leading end of the terminal is connected through a screwing member to a bus bar of the plurality of bus bars exposed from an opening provided on the circuit board,
the screwing member is held in an insulating holder housed in a housing recess provided in the heat dissipation plate, and
the heat dissipation plate is overlaid on the second surface of the circuit board so as to dissipate heat that is transferred to the second surface of the circuit board from the first surface of the circuit board.

2. The circuit assembly according to claim 1, wherein another opening is provided in a region of the circuit board corresponding to the main body, the another opening exposing the heat dissipation plate.

3. The circuit assembly according to claim 1, wherein the inductor is disposed on the first surface.

4. The circuit assembly according to claim 1, wherein a positioning protrusion that protrudes toward the circuit board is provided on the insulating holder, and a positioning hole is provided at a position on the circuit board that corresponds to the positioning protrusion.

5. The circuit assembly according to claim 1, wherein between the second surface of the circuit board and the heat dissipation plate, an insulating layer that covers a boundary between the insulating holder and the heat dissipation plate is provided at a region including the boundary.

* * * * *